United States Patent [19]
Hshieh et al.

[11] Patent Number: 6,049,104
[45] Date of Patent: Apr. 11, 2000

[54] MOSFET DEVICE TO REDUCE GATE-WIDTH WITHOUT INCREASING JFET RESISTANCE

[75] Inventors: Fwu-Iuan Hshieh, Saratoga; Shang-Lin Weng, Cupertino; David Haksung Koh, Sunnyvale; Chanh Ly, Concord, all of Calif.

[73] Assignee: MagePower Semiconductor Corp., San Jose, Calif.

[21] Appl. No.: 08/980,460

[22] Filed: Nov. 28, 1997

[51] Int. Cl.$^7$ .......................... H01L 29/76; H01L 29/94; H01L 31/062; H01L 31/113; H01L 31/119

[52] U.S. Cl. .......................... 257/328; 257/329; 257/335; 257/339; 257/341; 438/230; 438/231; 438/944; 438/948

[58] Field of Search ...................... 257/341, 329, 257/328, 335, 339; 438/230, 231, 944, 948

[56] References Cited

U.S. PATENT DOCUMENTS

| | | | |
|---|---|---|---|
| 5,248,627 | 9/1993 | Williams | 437/45 |
| 5,479,037 | 12/1995 | Hshieh et al. | 257/328 |
| 5,545,908 | 8/1996 | Tokura et al. | 257/341 |
| 5,731,611 | 3/1998 | Hshieh et al. | 257/341 |
| 5,757,046 | 5/1998 | Fujihira et al. | 257/339 |
| 5,844,277 | 12/1998 | Hshieh et al. | 257/341 |
| 5,894,150 | 4/1999 | Hshieh | 257/335 |

FOREIGN PATENT DOCUMENTS 362176168A  8/1987  Japan .

*Primary Examiner*—William Mintel
*Attorney, Agent, or Firm*—Bo-In Lin

[57] ABSTRACT

The present invention discloses a method for fabricating a MOSFET device supported on a substrate. The method includes the steps of (a) growing an oxide layer on the substrate followed by depositing a polysilicon layer and applying a gate mask for performing an undercutting dry etch for patterning a plurality of polysilicon gates with a gate width narrower than a width of the gate mask; (b) applying the gate mask as body implant blocking mask for implanting a body dopant followed by removing the gate mask and carrying out a body diffusion for forming body regions; (c) applying a source blocking mask for implanting a source dopant to form a plurality of source regions; (d) forming an overlying insulation layer covering the MOSFET device followed by applying a dry oxide etch with a contact mask as a second mask to open a plurality of contact openings there through then removing the contact mask; (e) performing a high temperature reflow process for the overlying insulation layer and for driving the source regions into designed junction depths; (f) depositing a metal layer followed by applying a metal mask for patterning the metal layer to define a plurality of metal segments.

16 Claims, 9 Drawing Sheets

MOSFET DEVICE TO REDUCE GATE-WIDTH WITHOUT INCREASING JFET RESISTANCE

BACKGROUND OF THE INVENTION

1. Field of the Invention

This invention relates generally to the structure and fabrication process of MOSFET power devices. More particularly, this invention relates to a new method of manufacturing the MOSFET device to reduce the width of polysilicon gates without increasing the JFET resistance, and also a higher switching speed is achieved with reduced gate-source capacitance. Meanwhile, a shallower source junction is formed in this novel device such that the device ruggedness is improved, a high breakdown voltage is maintained and an early punch through is also prevented.

2. Description of the Prior Art

Conventional structure and processing steps for fabricating a power metal oxide silicon field effect transistor (MOSFET) power device are limited by several technical difficulties. Specifically, conventional planar cellular structure of power MOSFETs, such as square, circular, and hexagonal topologies are limited by the difficulty that the on-resistance is decreased when the polysilicon space is reduced to achieve higher cell density by shrinking unit cell areas. However, a planar DMOS is limited by the surface area occupied by the polysilicon gate electrode. Additional reduction in the size of the gate electrode exacerbate the parasitic JFET pinching effect, leading to higher device on-resistance at a small cell pitch. Conversely, if the polysilicon gate dimension is held constant to avoid the pinching effect, and the size of the source/body region, i.e., the opening in the polysilicon, is reduced instead, the specific on-resistance still increases at high cell densities. This is caused by the transistor gate width per unit area decreases. With such electrical and geometric restrictions, the cell density is limited to 6.5 million cells/inch$^2$. For a person of ordinary skill in the art, further increases in planar DMOS cell density is unwarranted and likely to be detrimental to performance. The pinching effect caused by cell pitch reduction has to be eliminated to significantly benefit power MOSFET specific on-resistance. Additionally, the JFET resistance can be reduced with a shallower body junction. However, the breakdown voltage of the device is degraded with shallower body junctions. The tradeoffs of these performance characteristics become designer's dilemmas which cannot be easily resolved with conventional planar structures and current state of the art manufacturing technology.

FIG. 1 shows a typical vertical double diffused MOS (VDMOS) device which uses a double diffusion technique to control the channel length L. Two successive diffusions are performed with first a p diffusion using boron, then an N diffusion using either arsenic or phosphorus, to produce two closely spaced pn junctions at different depths below the silicon surface. With this pn-junction, as shown in FIG. 1, the VDMOS supports the drain voltage vertically in the N-epitaxial layer. The current flows laterally from the source through the channel, parallel to the surface of the silicon. The current flow then turns through a right angle to flow vertically down through the drain epitaxial layer to the substrate and to the drain contact. The p-type "body" region in which the channel is formed when a sufficient positive voltage is applied, and the n+ source contact regions are diffused successively through the same window etched in the oxide layer. The channel length can be controlled through the processing steps. Because of the relative doping concentrations in the diffused p-channel region and the N-layer, the depletion layer which supports BVdS, a drain to source voltage, extends down into the epitaxial layer rather than laterally into the channel.

As discussed above, when the width of the gates is reduced to increase the cell density, the body regions are pulled together. The JFET regions between the body regions are pinched and resulting in a higher JFET resistance, i.e., a higher R-JFET. Typically, for a body dopant such as boron, there is a ratio of lateral diffusion to vertical of approximately 0.8. Therefore, if the depth of the body is b, generally the body regions extend lateral from the edges of the gate with a distance of about 0.8b into a region under the gate. Referring to FIG. 2, where a conventional MOSFET device is shown with the body regions formed by implanting the body dopant ions, which are blocked by the polysilicon gates. The body regions are then formed by carrying out a body diffusion. The body regions as shown have a depth of b and a lateral diffusion length $\lambda$ of 0.8b measured from the edges of the gate. If the width of the gate is G, then the distance J between the body regions is approximately:

$$J=G-2\lambda=G-2(0.8b) \qquad (1)$$

As the width of the gate G is reduced, the distance J between the body regions is also reduced which causes the JFET resistance to increase. It appears, from Equation (1), that a longer distance of J may be maintained by keep a shallow P-body with reduced value of b. However, a shallow body would create several problems, e.g., device punch through, lower breakdown voltage and reduced device ruggedness. For these reasons, in a conventional MOSFET power device, it is difficult to maintain a same JFET resistance when the cell size is reduced.

Therefore, a need still exists in the art of power device fabrication, particularly for MOSFET design and fabrication, to provide a structure and fabrication process that would resolve these difficulties.

SUMMARY OF THE PRESENT INVENTION

It is therefore an object of the present invention to provide a new MOSFET fabrication process to provide an improved device structure with reduced gate-width while maintaining an unchanged dimension of JFET region and also having deep body regions and shallow source regions such that aforementioned limitations and difficulties as encountered in the prior art can be overcome.

Specifically, it is an object of the present invention to provide an improved MOSFET fabrication process wherein a special under-cutting dry etch process is applied in patterning the polysilicon gates such that the polysilicon gates are formed with width less than the overlying etch mask and a self aligned body implant is carried out by taking advantage of the wider polysilicon mask covering the gates such that reduced gate width is achieved without sacrificing the space of the JFET regions underneath the gates.

Another object of the present invention is to provide a novel MOSFET fabrication process wherein the source region implant is performed after the body diffusion is completed such that deep body regions can be formed first by a high temperature long duration diffusion process and shallow source regions can be subsequently formed without source dopant redistribution caused by a body diffusion whereby a MOSFET device with improved early punch through prevention, higher breakdown voltage, and enhanced ruggedness can be provided.

Another object of the present invention is to provide a novel MOSFET fabrication process wherein polysilicon gates of reduced width are formed by applying an under-cutting dry etch process without sacrificing the space of the JFET regions such that switching speed is improved with reduced gate-to-source capacitance while maintaining a low on-resistance when the dimension of the JFET regions is kept unchanged.

Another object of the present invention is to provide an improved MOSFET fabrication process in a preferred embodiment wherein a second body implant is performed after the polysilicon mask is removed subsequent to the completion of the first body implant such that the threshold voltage can be properly adjusted without adversely affecting the JFET resistance.

Another object of the present invention is to provide an improved MOSFET fabrication process wherein initial-oxide blocking stamps are formed by patterning the initial oxide layer in the core cell area and the body regions are formed by taking advantage of lateral diffusion to form a merged body region such that the requirement of a source blocking mask can be eliminated.

Another object of the present invention is to an improved MOSFET fabrication process wherein initial-oxide blocking stumps are formed by patterning the initial oxide layer in the core cell area and the polysilicon stingers along the initial oxide side walls are removed because of the undercut of the polysilicon gates such that potential problems of polysilicon stingers occurring in conventional anisotropic etch during contact oxide etch can be totally resolved.

Briefly, in a preferred embodiment, the present invention includes a method for fabricating a MOSFET device supported on a substrate. The method includes the steps of (a) growing an oxide layer on the substrate followed by depositing a polysilicon layer and applying a gate mask for performing an under-cutting dry etch for patterning a plurality of polysilicon gates with a gate width narrower than a width of the gate mask; (b) applying the gate mask as body implant blocking mask for implanting a body dopant followed by removing the gate mask and carrying out a body diffusion for forming body regions; (c) applying a source blocking mask for implanting a source dopant to form a plurality of source regions; (d) forming an overlying insulation layer covering the MOSFET device followed by applying a dry oxide etch with a contact mask as a second mask to open a plurality of contact openings there through then removing the contact mask; (e) performing a high temperature reflow process for the overlying insulation layer and for driving the source regions into designed junction depths; (f) depositing a metal layer followed by applying a metal mask for patterning the metal layer to define a plurality of metal segments.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 3A:
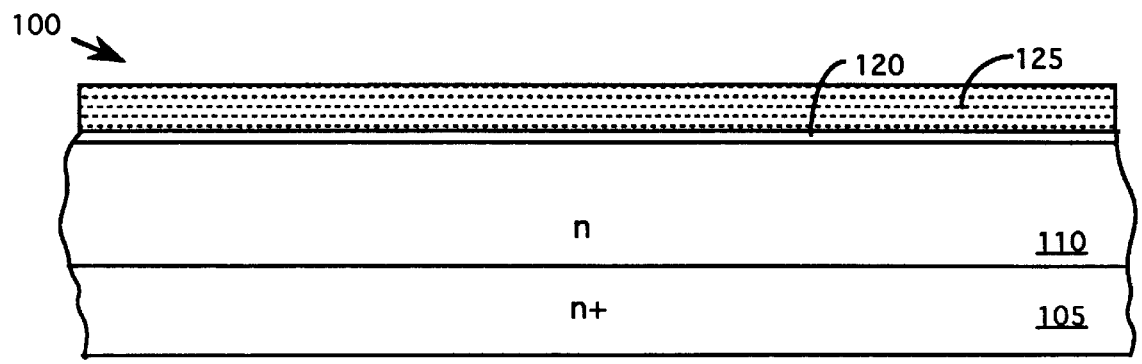
FIGS. 3A to 3F show the processing steps for manufacturing a MOSFET device of the present invention.
Figure 3B:
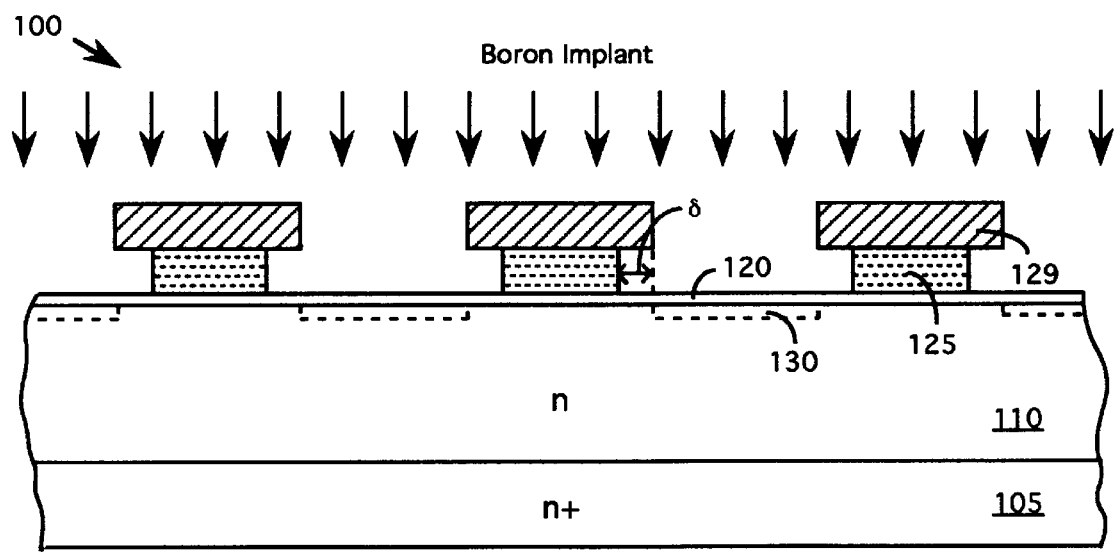

Referring to FIGS. 3A to 3H for the processing steps applied to manufacture the MOSFET device 100. As shown in FIG. 3A, the processing steps begins by first growing an N epitaxial layer 110 with a resistivity ranging from 0.1 to 10 ohm-cm on top of an N+ substrate 105. The substrate has a resistivity of 0.001 to 0.02 ohm-cm. The thickness and the resistivity of the epitaxial layer 110 depend on the requirements for the on-resistance and breakdown voltage. In a preferred embodiment, the thickness of the epi-layer 110 is about six to eight microns. A gate oxide layer 120 of thickness in the range of 100 to 1000 Angstroms is grown. A polysilicon layer 125 having a thickness of approximately 3000 to 10,000 Angstroms is then deposited. A POCL3 doping process is carried out followed by an arsenic (As) implant process with an ion beam of energy at 60–80 Kev with a flux density in the range between 5 to $8 \times 10^{15}/cm^2$ In FIG. 3B, a specially configured polysilicon mask 129 is applied for carrying out a special isotropic under-cut dry etch to pattern the polysilicon layer 125. This special isotropic under-cut dry etch removes the polysilicon layer not covered by the polysilicon layer and additionally remove an under-cut portion. The under-cut portion of the polysilicon layer has a distance δ measured from the edges of the polysilicon layer. Comparing to a conventional MOSFET device, this width of gates 125 is reduced by 2δ when a same polysilicon mask is applied because of this under-cutting dry etch process. Unlike a conventional step of removing the polysilicon mask 129, the manufacture process of this invention keeps the polysilicon mask 129 in place. A p-body implant at 20–80 Kev with an ion-beam of $5 \times 10^{13}$ to $3 \times 10^{14}/cm^2$ flux density is applied to implant the p-body regions 130.

Figure 3C:
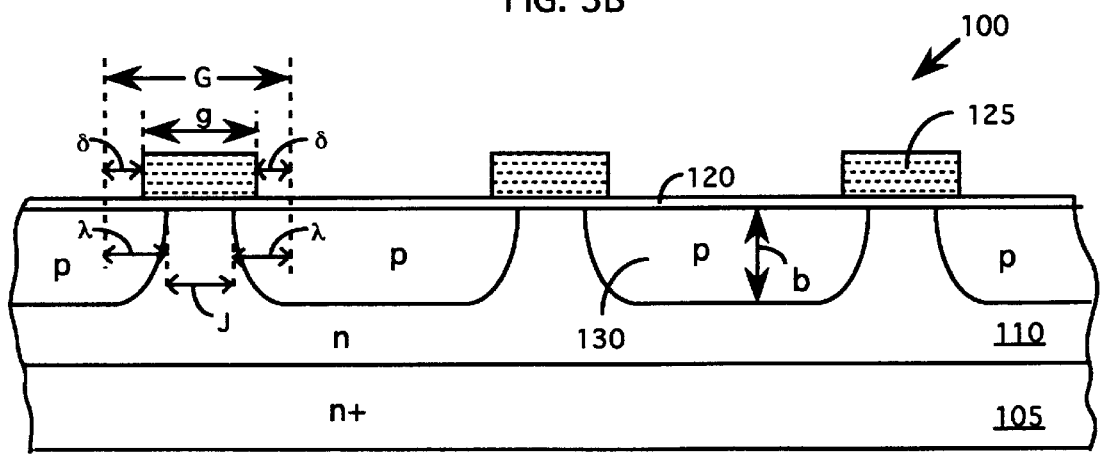

In FIG. 3C, the polysilicon mask 129 is removed after the body implant, and a p-body diffusion process is carried out at an elevated temperature of 1,000–1,200° C. for ten minutes to three hours to increase the depth of the p-body region 130 to 2.0–6.0 μm. Meanwhile, because of the lateral diffusion, the body regions are extended to the regions under the gate. As will be further discussed below, the MOSFET device manufactured by this process is provided with gates of smaller width without sacrificing the space allowed for the JFET regions. Even now the width of the gates is shrunken, a same low JFET resistance is maintained as that for a device of lower cell density without being adversely impacted by the gates of reduced width As shown in FIG. 3C, the body regions have a depth of b and a lateral diffusion length λ is 0.8b measured from the edges of the mask. If the width of the mask is G, then the distance J between the body regions is approximately.

$$J = G - 2\lambda = G - 2(0.8b) \qquad (2)$$

Compare to Equation (1), the dimension of the JFET region is maintained the same while the width of the gate is now reduced to g, where $$g = G - 2\delta \quad (3)$$

Figure 1:
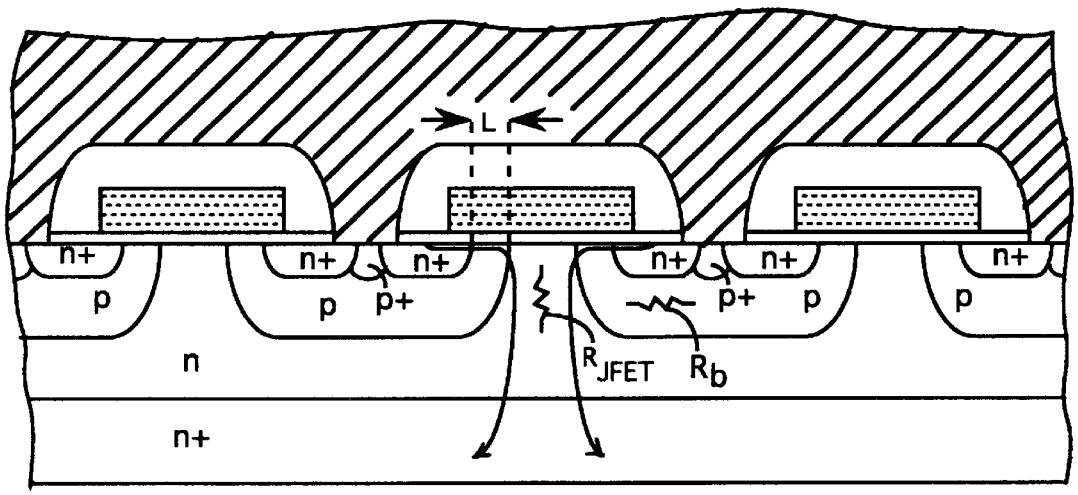
FIG. 1 is cross sectional view of a prior art MOSFET device wherein reduction of the width of gates in order to produce power device of higher transistor cell density directly causes the JFET resistance to increase.
Figure 2:
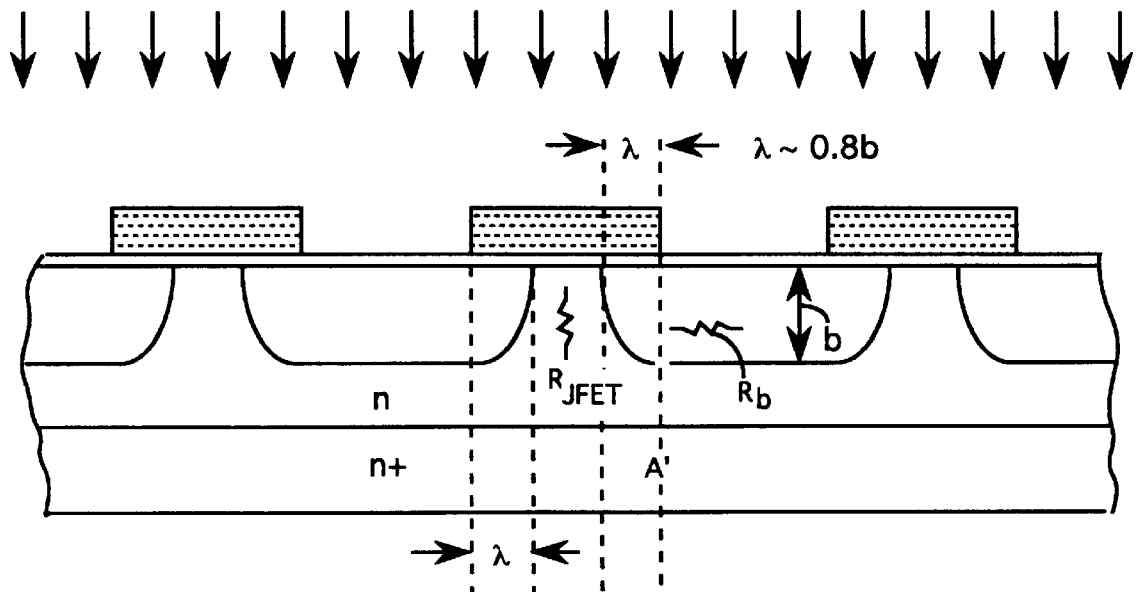
FIGS. 2 is a cross section showing the relative positions of the body regions and the gate due to the lateral diffusion of the body regions.

In a preferred embodiment the under cut portion has a length d=0.1 to 1.0 μm. Therefore, compared to a conventional MOSFET as that shown in FIGS. 1 and 2, by forming a p-body with the same depth, a narrower gate can be formed while maintaining the space of the JFET region unchanged.

Figure 3D:
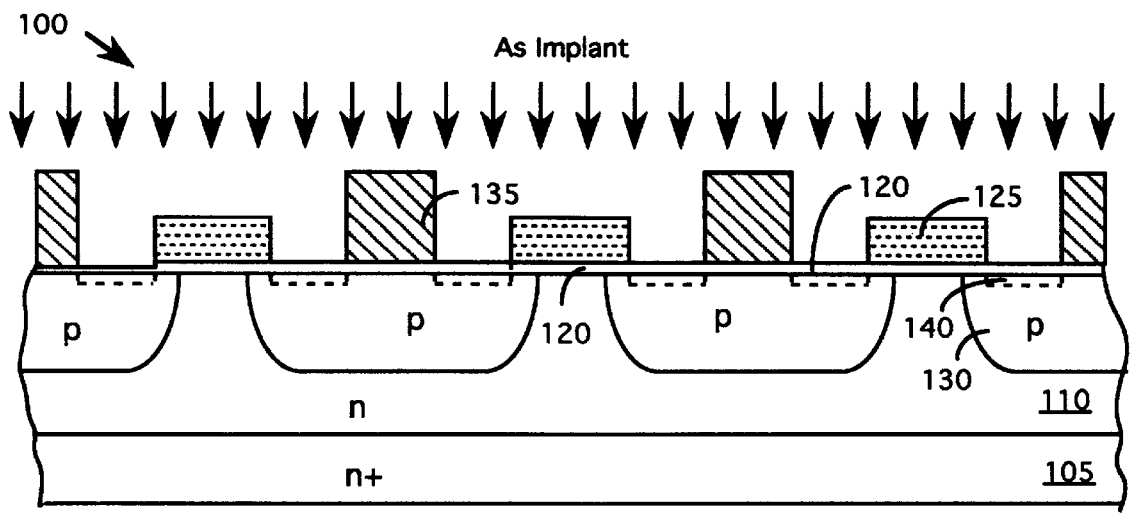

Referring to FIG. 3D, a source-blocking mask 135 is applied to carry out a source implant with a source ion beam of either a phosphorus ions at an energy of 60–100 Kev and ion flux density of $5 \times 10^{15}$ to $1 \times 10^{16}/cm^2$ or an arsenic ions at an energy of 60–150 Kev and ion flux density of $1 \times 10^{15}$ to $1 \times 10^{16}/cm^2$ to form the source regions 140. In FIG. 3G, a BPSG or PSG layer is deposited to form an insulation layer 145 of approximately 5000–15,000 Å in thickness. A contact mask (not shown) is applied to first perform a dry etch to etch the insulation layer 145 to define a plurality of contact windows 150. A shallow body implant is performed to form a shallow high concentration body region 160 with either a low energy boron implant with an ion flux of $1 \times 10^{14}$ to $2 \times 10^{15}/cm^2$ at about 20 to 60 Kev or a high energy $BF_2$ implant with an ion flux of $1 \times 10^{14}/cm^2$ to $2 \times 10^{15}$ at about 100–240 Kev.

Figure 3E:
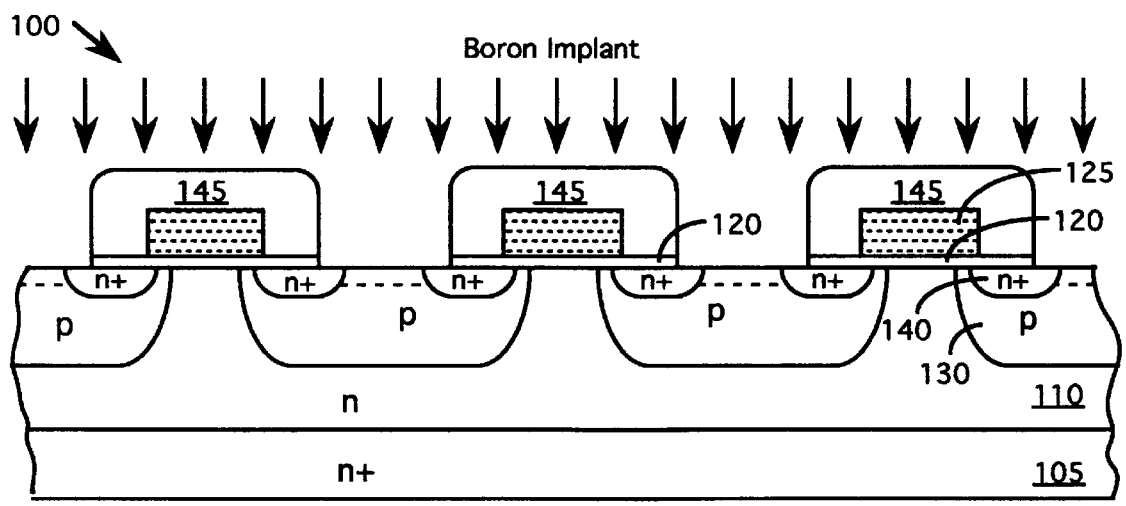
Figure 3F:
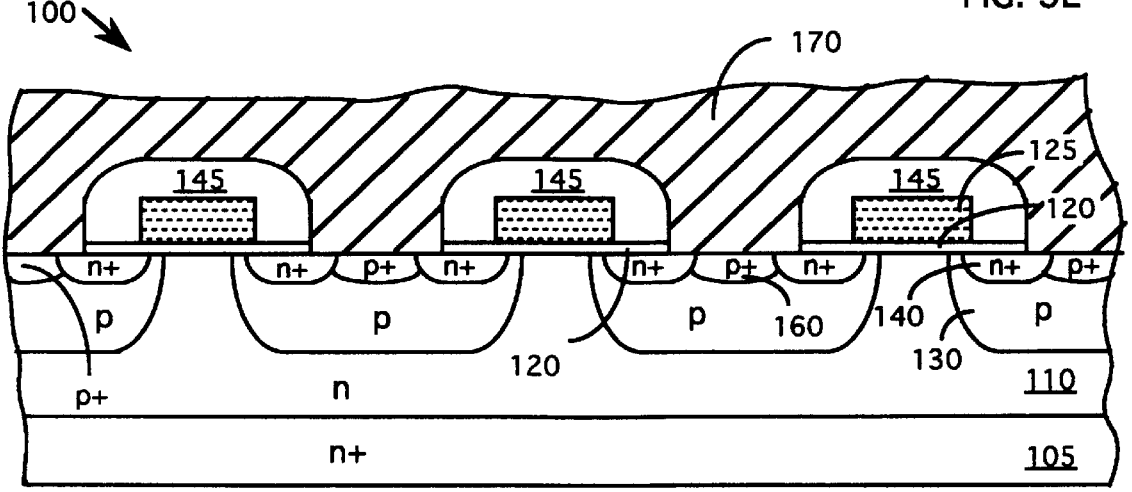

Referring to FIG. 3E, the contact mask 148 is removed. A BPSG reflow and densification process is performed at 900–950° C. for thirty minutes to one hour. The source regions 140 are driven to a desired junction depth ranging from 0.1 to 0.5 μm by a the elevated temperature. The shallow high concentration body dopant region 160 is also driven to a deeper depth in the body regions 130. In FIG. 3F, a metal layer is deposited to form a metal layer 170 and a metal mask is applied to define a plurality of metal segments, including source metal, gate metal, field plate and equal potential ring (EQR). For the sake of simplicity, the details of these segments are not shown.

Figure 4A:
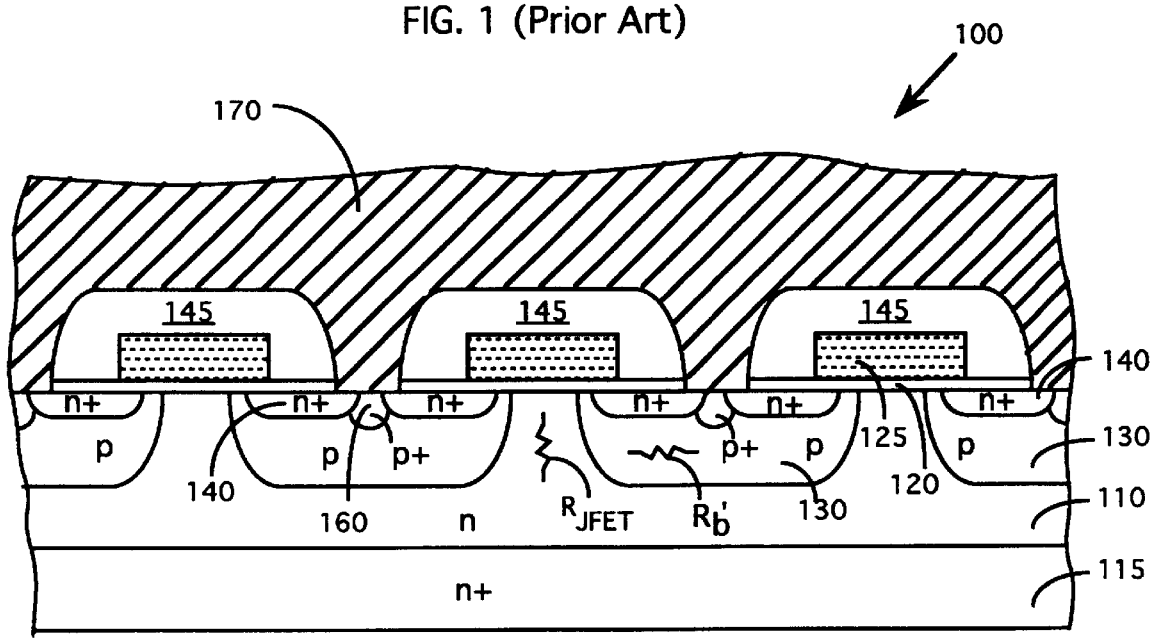
FIGS. 4A to 4B are two cross sectional views of the MOSFET device manufactured by applying the processing steps shown in FIGS. 3A to 3H.
Figure 4B:
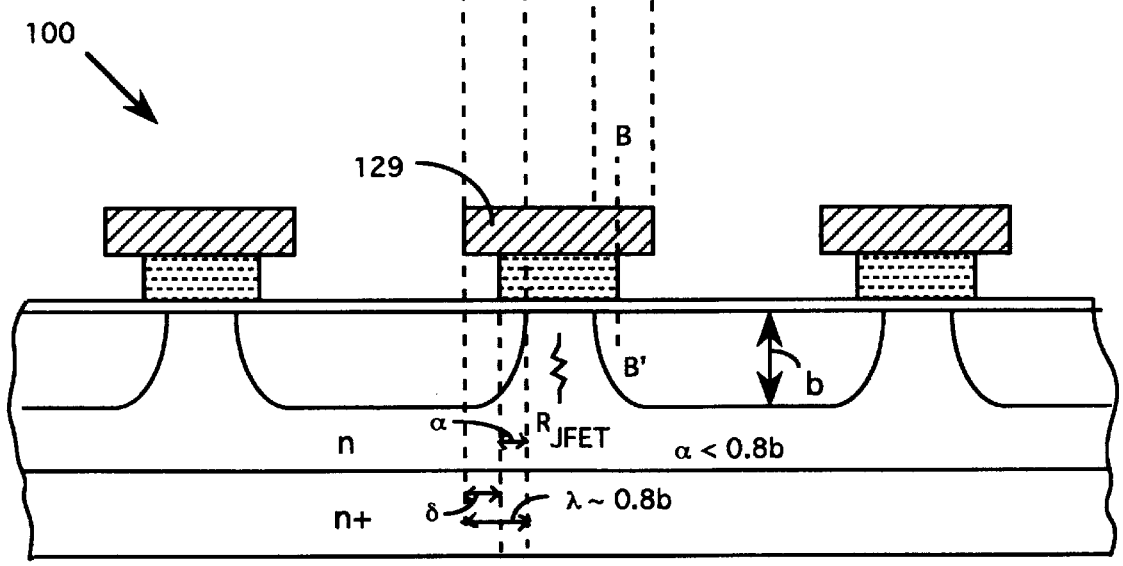

Referring to FIGS. 4A and 4B for two cross sectional views for a detail description of the novel MOSFET power device 100 manufactured according to the processing steps described above. The MOSFET device 100 is supported on an N+ substrate 105 functioning as a drain for the device. An N epitaxial layer 110 is formed over the substrate. The MOSFET power device 100 includes a plurality polysilicon-gate 125 disposed over a gate oxide layer 120. The polysilicon-gate has a width g. The MOSFET power device 100 further includes a plurality of MOSFET transistor cells for each of the gates 125, wherein each transistor cells further includes a source region 140, a body region 130. The transistor cells further have a common drain disposed at a bottom surface of the substrate 105. Each of the polysilicon gates 125 is a polysilicon segment. An overlying insulation layer 145 covers the MOSFET cells. Each cell has a plurality of contact openings. The MOSFET device further includes a plurality of metal segments, e.g., segments 170 (S), covering the overlying insulation layer and being in electric contact with the MOSFET device through the contact openings. Each of the transistor-cells further includes a shallow high concentration body dopant region 160 disposed near the substrate surface under the contact openings which is doped with higher concentration of body dopant to reduce the contact resistance between the source contact 170 and the MOSFET device. The special structural characteristics of this MOSFET device can be better understood by referring to FIG. 4B. With the polysilicon mask 129 employed as a blocking mask for body implant, the lateral diffusion of the body dopant ions after the body diffusion process is 0.8b extends toward the gate 125. Where b is the depth of the body region 130, which is the vertical diffusion length of the body dopant ions. When a portion of the gate 125 having a width of δ is removed by the under-cutting dry etch, the distance of the body regions 130 extended into the region underneath the gate 125 is a and $$\alpha = 0.8b - \delta < 0.8b \quad (4)$$

Therefore, the MOSFET transistor cells now have a novel and different structurally where the body regions are caused to extend in the substrate into a region under the gates with a distance, measured from the edges of the gate, less than a lateral diffusion length of the body dopant ions.

Figure 5A:
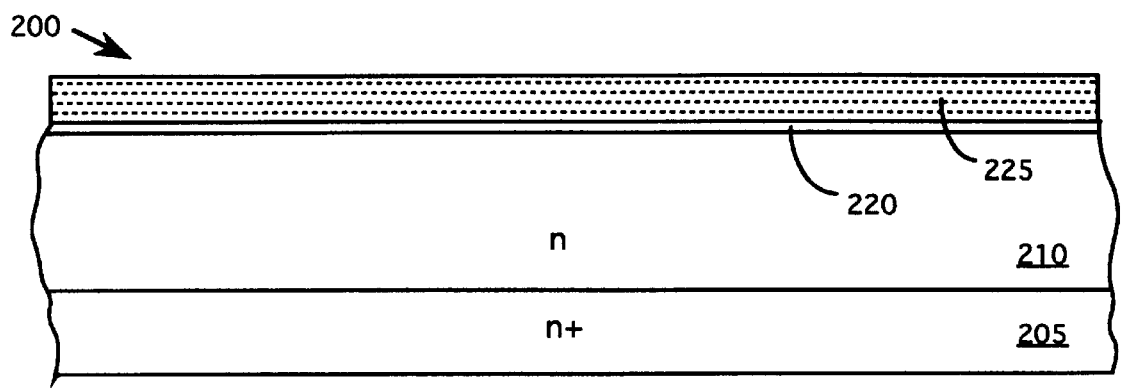
FIGS. 5A to 5E are cross sectional views for illustrating the processing steps to manufacture another preferred embodiment of the present invention.
Figure 5B:
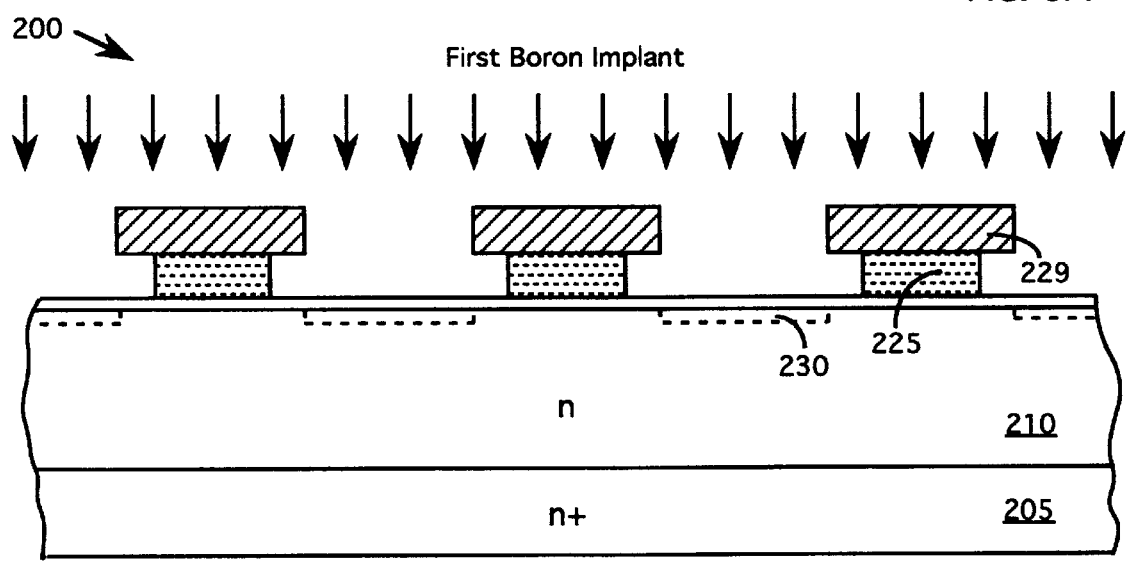

Referring to FIGS. 5A to 5E for a sequence of cross sectional views to illustrate the processing steps for manufacturing a second preferred embodiment, i.e., a MOSFET power device 200, of this invention. Since the processing steps are very similar to that shown in FIGS. 3A to 3F, some of the details are not repeated. As shown in FIG. 5A, the processing steps begins by first growing an N epitaxial layer 210 on top of an N+ substrate 205. A gate oxide layer 220 of thickness in the range of 100 to 1000 Angstroms is grown. A polysilicon layer 225 having a thickness of approximately 3000 to 10,000 Angstroms is then deposited. A POCL3 doping process is carried out followed by an arsenic (As) implant process with an ion beam of energy at 60–80 Kev with a flux density in the range between 5 to $5 \times 10^{15}/cm^2$ In FIG. 5B, a specially configured polysilicon mask 229 is applied for carrying out a special isotropic under-cut dry etch to pattern the polysilicon layer 225. This special isotropic under-cut dry etch removes the polysilicon layer not covered by the polysilicon layer and additionally remove an under-cut portion. The under-cut portion of the polysilicon layer has a distance δ measured from the edges of the polysilicon layer. A p-body implant at 20–80 Kev with an ion-beam of $7 \times 10^{13}$ to $3 \times 10^{14}/cm^2$ flux density is applied to implant the p-body regions 230.

Figure 5C:
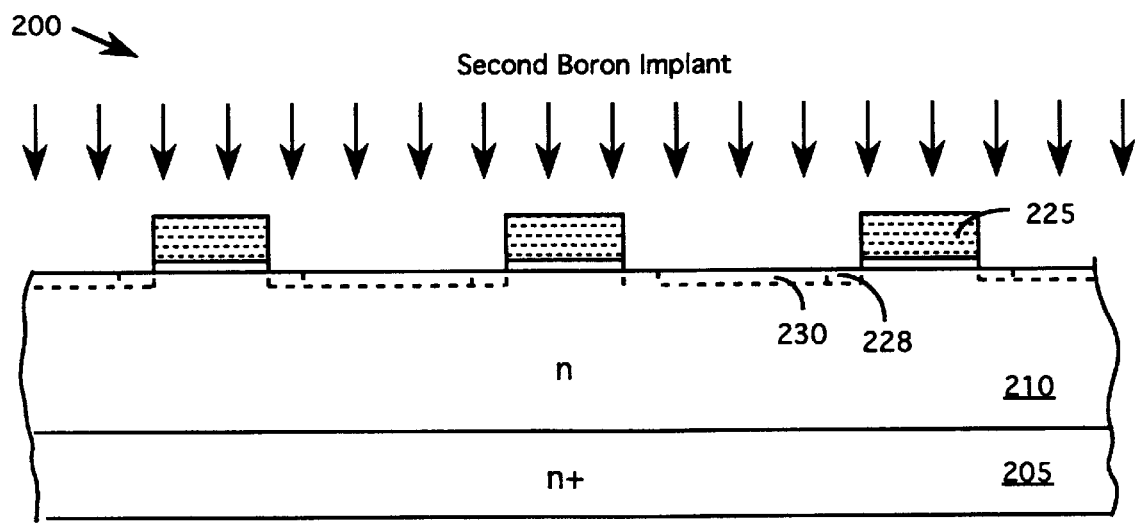
Figure 5D:
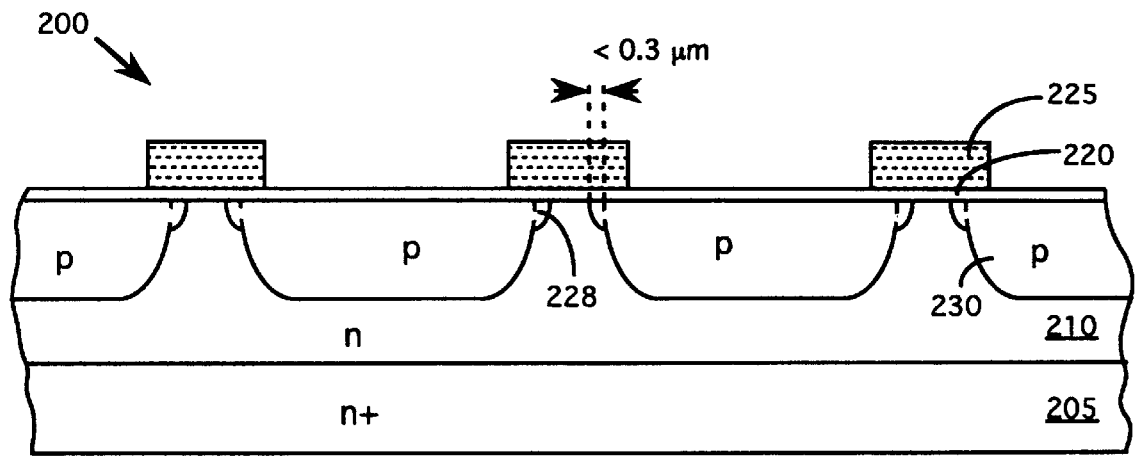
Figure 5E:
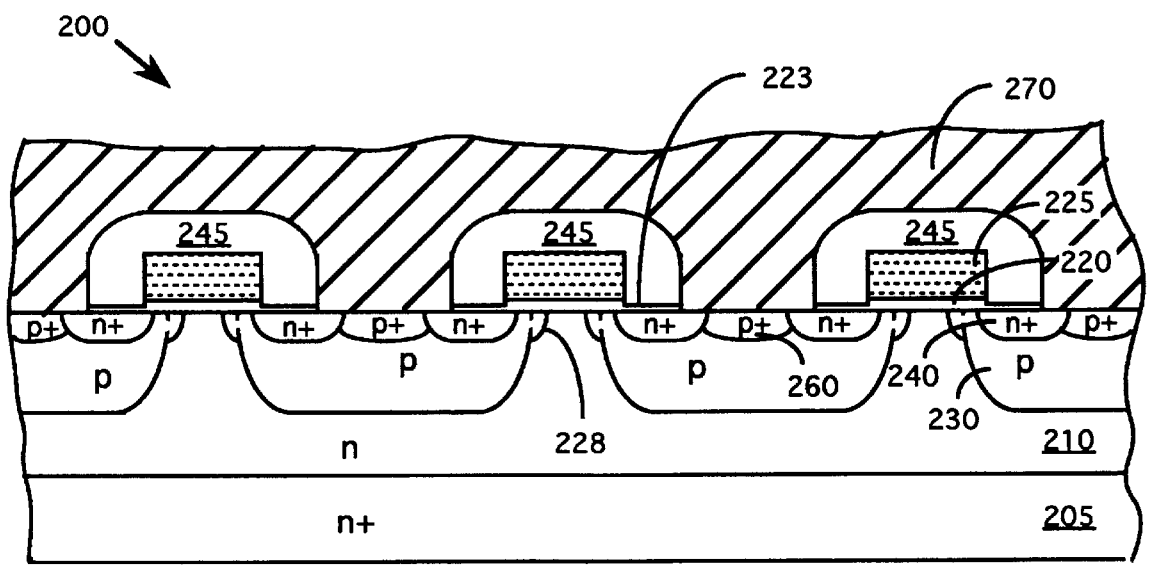

In FIG. 5C, the polysilicon mask 129 is removed after the body implant, a second body implant is carried out with boron ions at 20 to 80 Kev with an ion-beam of $1 \times 10^{13}$ to $3 \times 10^{13}/cm^2$ to form a plurality of outer edge shallow body region 228 near outer edges of the body regions 130 under the edges of the gates 125. Then, a p-body diffusion process is carried out at an elevated temperature of 1,000–1,200° C. for ten minutes to three hours to increase the depth of the p-body region 130 to 1.0–3.0 μm. The outer-edge shallow body regions 228 are also laterally diffused to be underneath the gates 125. Because of the light dose of the body dopant, these outer-edge shallow body regions 228 are vertically diffused to a shallow depth of approximately 0.5 to 1.2 μm. The outer-edge shallow regions 228 also extend outwardly for an additional distance of about 0.05 to 0.2 μm from the outer edges of the body regions 230. The outer-edge shallow body regions 228 are formed to properly adjust the threshold voltage and improve the prevention of punch through. Because of the shallow depth of this region, there is virtually no impact to the JFET resistance caused by this outer-edge shallow body regions 228. Subsequent processing steps are identical as that described above for manufacturing the MOSFET device 100. The MOSFET power device 200 as that shown in FIG. 5E is the same as MOSFET device 100 except that there are the outer-edge shallow body regions 228 implemented to adjust the threshold voltage and to prevent punch through for the MOSFET device 200.

In summary, this invention discloses a vertical power transistor cell supported on a substrate 205 of a first conductivity type, e.g., n-type conductivity, functioning as a drain. The transistor cell includes a gate disposed above the substrate substantially at a center potion of the transistor cell. The transistor cell further includes a body region 230 containing a plurality of body dopant-ions of a second conductivity type, e.g., p-type conductivity, disposed in the substrate. The body region 230 surrounds the gate 225 with an under-gate-portion extending underneath the gate wherein the under-gate-portion having a width less than a lateral diffusion of the body dopant-ions. In a preferred embodiment, the under-gate-potion further includes an outer-edge shallow body region 228 disposed at an outer edge of the body region 230 extending toward a center portion under the gate having a shallower depth than the body region 230. In an alternate preferred embodiment, the transistor cell further includes a source region 240 of the first conductivity type, e.g., n-type source region, disposed in the substrate surrounding the gate 225 with a portion extending under the polysilicon gate. And, the outer-edge shallow body region 228 disposed at an outer edge of the body 230 having a depth substantially same as the source region 240. In a preferred embodiment, the body region 230 has a depth of δ in the substrate and the under-gate-portion has a width less than 0.8δ. In an alternate preferred embodiment, the under-gate-portion has a width of 0.8δ–λ and λ representing a gate-undercut distance ranging substantially between 0.2 to 0.6 micrometers. In an alternate preferred embodiment, the body region 230 is a merged-body region, e.g., merged body region 330 having a broad-W-shaped bottom.

Figure 6A:
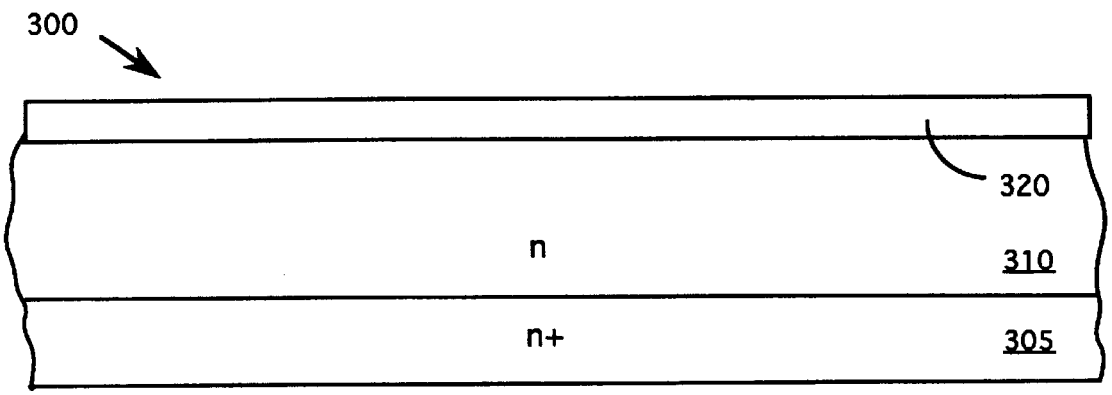
FIGS. 6A and 6F are cross sectional views for illustrating the processing steps to manufacture another preferred embodiment of the present invention.

Referring to FIGS. 6A to 6E for the processing steps of another power MOSFET device 300 of this invention. As shown in FIG. 6A, the processing steps begins by first growing an N epitaxial layer 310 on top of an N+ substrate 305. An initial oxide layer is grown having a thickness ranging from 4,000 to 10,000 Å.

Figure 6B:
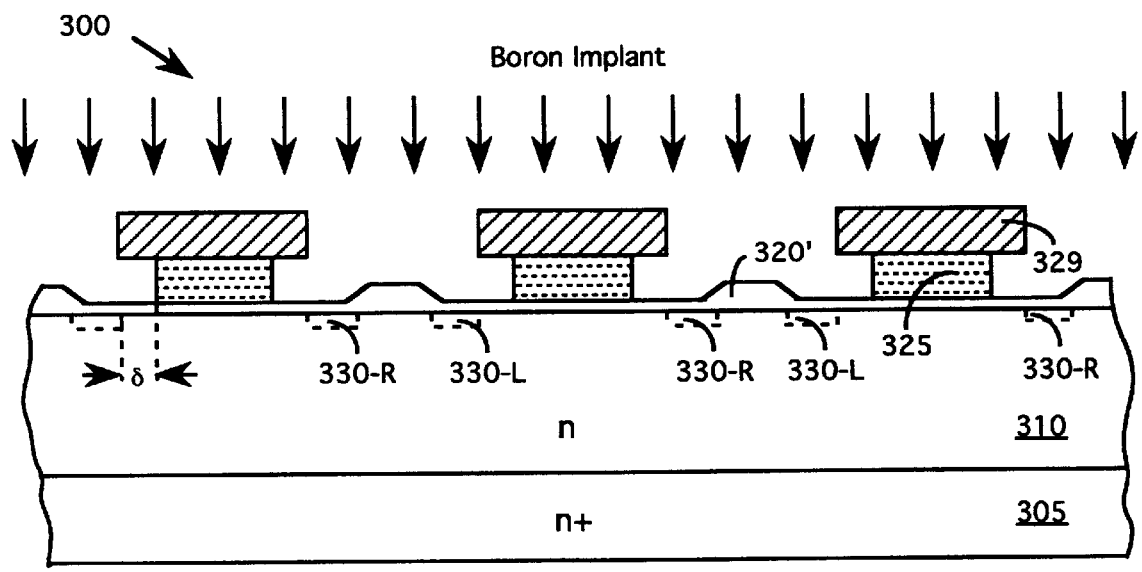

Referring to FIG. 6B, a specially configured active mask is employed to etch the initial oxide layer 320 for defining a plurality of oxide blocks 320'. The width of the oxide blocks 320' is controlled to be less than two times of the lateral diffusion length of the body dopant ions. Then a polysilicon layer 325 having a thickness of approximately 3000 to 10,000 Angstroms is deposited and followed by a POCL3 doping process. A specially configured polysilicon mask 329 is applied for carrying out a special isotropic under-cut dry etch to pattern the polysilicon layer 325. This special isotropic under-cut dry etch removes the polysilicon stringer Along the oxide plugs and additionally remove an under-cut portion. The under-cut portion of the polysilicon layer has a distance measured from the edges of the polysilicon layer. A p-body implant at 20–80 Kev with an ion-beam of $7\times10^{13}$ to $3\times10^{14}/cm^2$ flux density is applied to implant the p-body regions 330. Each of the p-body regions are implanted as two separate regions 330-L representing the left body regions and 330-R representing the right body regions.

Figure 6C:
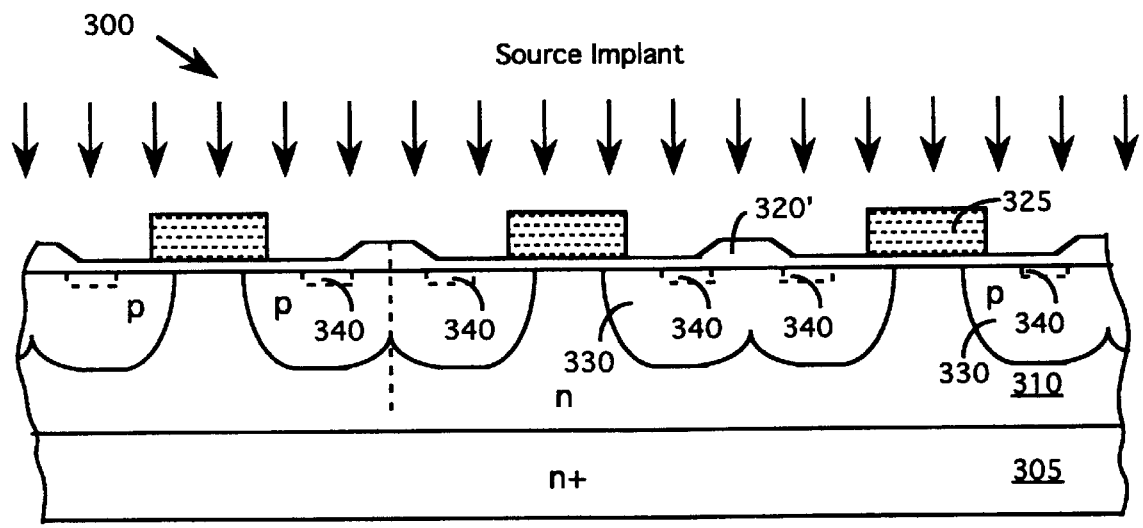

In FIG. 6C, the polysilicon mask 329 is removed after the body implant, a p-body diffusion process is carried out at an elevated temperature of 1,000–1,200° C. for ten minutes to three hours to increase the depth of the p-body region 130 to 1.0–3.0 μm. Because the oxide blocks 320' have a width less than two times of the lateral diffusion of the body dopant ions, e.g., boron ions, the left body region 330-L and the right body region 330-R are merged as a single body region 330 with a wide W-shaped bottom. The oxide blocks 320' are then employed as source ion blocks to carry out a source implant to form a plurality of source regions 340 without requiring the use of a source-blocking mask.

Figure 6D:
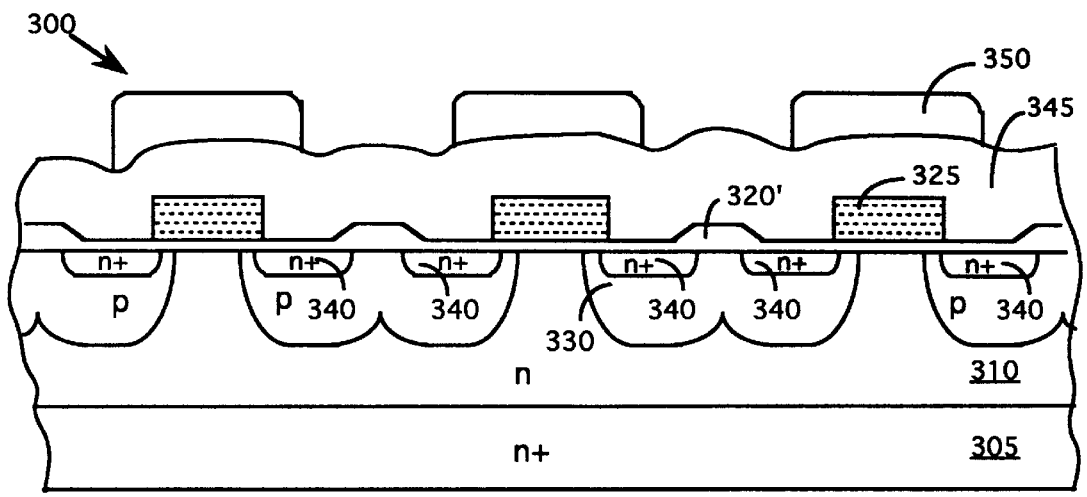
Figure 6E:
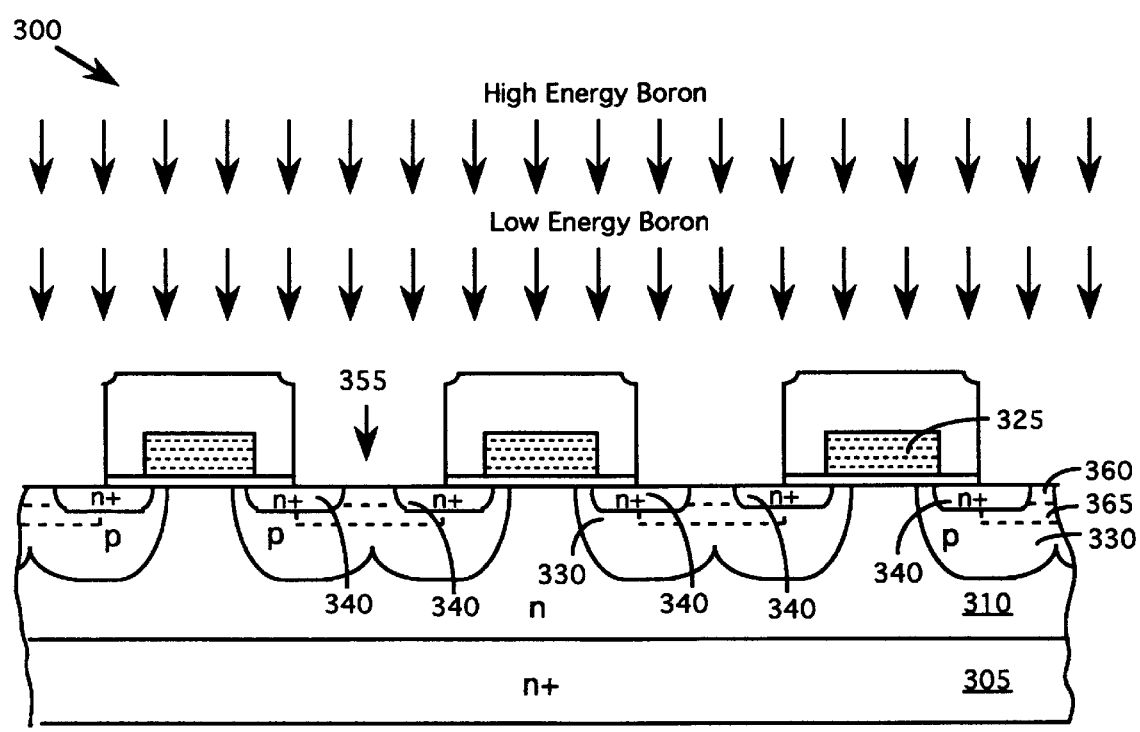

In FIG. 6D, a BPSG or PSG layer is deposited to form an insulation layer 345 of approximately 5000–15,000 Å in thickness. A contact mask 350 is applied to first perform a dry etch to etch the insulation layer 345 to define a plurality of contact windows 355. Referring to FIG. 6E, through these contact windows 355, a shallow body implant is performed to form a shallow high concentration body region 360 with either a low energy boron implant with an ion flux of $1\times10^{14}$ to $2\times10^{15}/cm^2$ at about 20 to 60 Kev or a high energy BF2 implant with an ion flux of $1\times10^{14}$ to $2\times10^{15}/cm^2$ at about 100–240 Kev. Then a high energy body implant is carried out by either skipping a step of growing an implant oxide layer or implanting with an implant angle smaller than seven degree (7°), e.g., at zero degree relative to the perpendicular direction to the top surface of the substrate. The purpose is to form a deep high concentration body region 365 with boron ions of an ion flux of about $3\times10^{14}$ to $1\times10^{16}/cm^2$ at about 100 to 300 Kev.

Figure 6F:
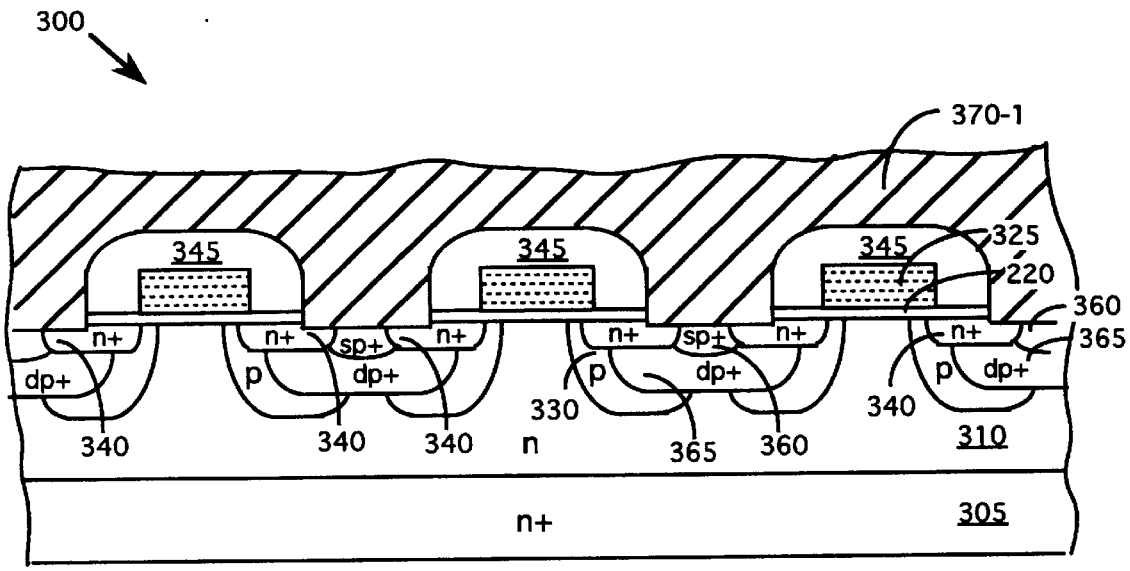

Referring to FIG. 6F, the contact mask 350 is removed. A BPSG reflow and densification process is performed at 900–950° C. for thirty minutes to one hour. The source regions 340 are driven to desired junction depth ranging from 0.2 to 1.0 μm by a the elevated temperature and the shallow and deep high concentration body dopant regions 360 and 365 are also driven to a deeper depth in the body regions 330. A metal layer is deposited to form a metal layer 370 and a metal mask is applied to define a plurality of metal segments, including source metal 370-1, gate metal, field plate and equal potential ring (EQR). Since they are not the main features of this invention, the details of these metal segments are not shown.

Figure 7:
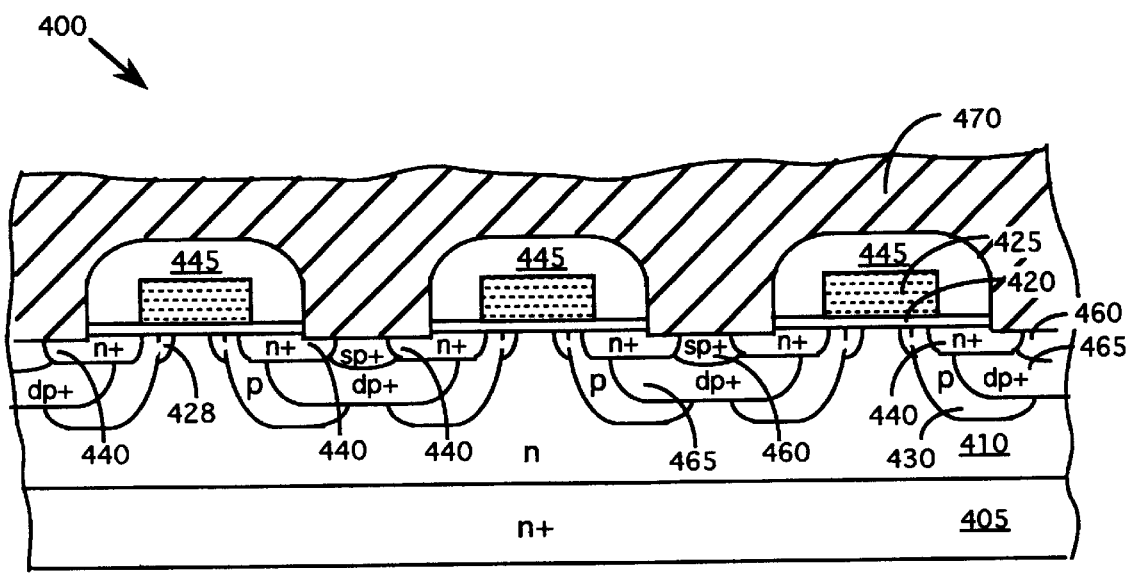
FIG. 7 is a cross sectional view of another preferred embodiment of the present invention.

Referring to FIG. 7 for another MOSFET power device 400 as another preferred embodiment of this invention. The MOSFET device 400 is manufactured and structured identical to the MOSFET 300 described above. The only difference is that the body regions 430 of the MOSFET device 400 also includes an outer-edge shallow body region 428. The outer-edge shallow body regions 428 extends outwardly from the body regions 430 with a lateral length of less than 0.2 μm. As described above, the outer-edge shallow body region 428 can be employed to properly adjust the threshold voltage and also provides the benefit of preventing punch through of the MOSFET device 400.

According to FIGS. 3A to 4B and the above description, this invention discloses a method for fabricating a MOSFET device supported on a substrate 105. The method includes the steps of (a) growing an oxide layer 120 on the substrate 110 followed by depositing a polysilicon layer 125 and applying a gate mask 129 for performing an under-cutting dry etch for patterning a plurality of polysilicon gates 125 with a gate width g narrower than a width of the gate mask G; (b) applying the gate mask 129 as body implant blocking mask for implanting a body dopant followed by removing the gate mask 129 and carrying out a body diffusion for forming body regions 130; (c) applying a source blocking mask 135 for implanting a source dopant to form a plurality of source regions 140; (d) forming an overlying insulation layer 145 covering the MOSFET device followed by applying a dry oxide etch with a contact mask to open a plurality of contact openings there-through then removing the contact mask; (e) performing a high temperature reflow process for the overlying insulation layer 145 and for driving the source regions 140 into designed junction depths; (f) depositing a metal layer 170 followed by applying a metal mask for patterning the metal layer to define a plurality of metal segments.

In another preferred embodiment, the method of fabricating the MOSFET device further comprising the steps of (b1)

performing a shallow light dose body dopant implant following the step of removing the gate mask for forming a plurality of outer-edge shallow body regions at outer edges of the body regions. In another preferred embodiment, the step (a) of performing an under-cutting dry etch for patterning a plurality of polysilicon gates is a step of under-cutting the polysilicon gates for about 0.2 to 0.6 micrometers. And, the step (b) of carrying out a body diffusion for forming a plurality of body regions is a step of forming the body regions having a body region depth of about 1.0 to 3.0 micrometers. In another preferred embodiment, the step (b3) of carrying out a body diffusion following the shallow light dose body dopant implant in forming the outer-edge shallow body regions is a step of forming the outer-edge shallow body regions to extend outwardly from the body regions for less than 0.2 micrometers. In another preferred embodiment, the step (d) of opening a plurality of contact openings further includes a step (d1) of performing a low energy body dopant implant through the contact openings, following the step of removing the contact mask, to form a shallow high concentration body dopant region. And a step (d2) of performing a high energy body dopant implant through the contact openings to form a plurality of deep high concentration body dopant regions in the body regions.

Therefore, the present invention discloses a new MOSFET fabrication process to provide an improved device structure with reduced gate-width while maintaining an unchanged dimension of JFET region. The device further has deep body regions and shallow source regions such that limitations and difficulties encountered in the prior art are overcome. Specifically, a special under-cutting dry etch process is applied in patterning the polysilicon gates such that the polysilicon gates are formed with width less than the overlying etch mask and a self aligned body implant is carried out by taking advantage of the wider polysilicon mask covering the gates such that reduced gate-width is achieved without sacrificing the space of the JFET regions underneath the gates. These processing steps form a MOSFET device with improved early punch through prevention, higher breakdown voltage, and enhanced ruggedness. The switching speed is also improved with reduced gate-to-source capacitance while maintaining a low on-resistance when the dimension of the JFET regions is kept unchanged. In a preferred embodiment, a second body implant is performed after the polysilicon mask is removed subsequent to the completion of the first body implant such that the threshold voltage can be properly adjusted without adversely affecting the JFET resistance. In another preferred embodiment, the initial oxide layer in the core cell area is patterned to form the initial-oxide implanting-ion blocks. Taking advantage of lateral diffusion to form a merged body region can eliminate the requirement of a source-blocking mask. Furthermore, the polysilicon stingers along the initial oxide sidewalls are removed during an isotropic polysilicon etch such that potential problems the polysilicon stingers left in the contact areas after the contact oxide etch can be totally resolved.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternatives and modifications as fall within the true spirit and scope of the invention.

We claim:

1. A vertical MOSFET transistor cell supported on a substrate of a first conductivity type functioning as a drain, the transistor cell comprising:
a polysilicon gate disposed above said substrate substantially at a center potion of said transistor cell; and
a body-dopant implant blocking-mask covering said gate and extending a distance $\delta$ over edges of said polysilicon gate thus defining a body-dopant implant window having a width equal to D–2$\delta$ wherein D is a distance between a gate and a neighboring gate.

2. The vertical MOSFET transistor cell as recited in claim 1 wherein:
a body implant region of a second conductivity type opposite to said first conductivity type disposed in said substrate aligned with said body dopant implant window.

3. The vertical MOSFET transistor cell as recited in claim 1 further comprising:
a source-dopant implant-block comprising an oxide block on top of said substrate disposed in a mid portion between said gate and a neighboring gate wherein said oxide block has a width less than two times of a lateral diffusion length of a body dopant.

4. The vertical MOSFET transistor cell as recited in claim 3 further comprising:
a source implant region of said first conductivity type disposed in said substrate aligned with a source-dopant implant window defined by an area between edges of said gate and said source-dopant implant-block.

5. The vertical MOSFET transistor cell as recited in claim 2 further comprising:
a second body implant region of said second conductivity type disposed immediately next to and aligned with edges of said gate having a depth shallower than said body dopant implant region aligned with said body dopant implant window.

6. A vertical MOSFET transistor cell supported on a substrate of a first conductivity type functioning as a drain, the transistor cell comprising:
a polysilicon gate disposed above said substrate substantially at a center potion of said transistor cell;
a source-dopant implant-block comprising an oxide block on top of said substrate disposed in a mid portion between said gate and a neighboring gate wherein said oxide block having a width less than two times of a lateral diffusion length of a body dopant;
a body-dopant implant blocking-mask covering said gate and extending a distance $\delta$ over edges of said polysilicon gate thus defining a body-dopant implant window between edges of said body-dopant implant blocking mask and edges of said source-dopant implant-block having a width equal to D'–$\delta$ wherein D' is a distance between edges of said gate and edges of said source-dopant implant-block.

7. The vertical MOSFET transistor cell as recited in claim 6 further comprising:
a body implant region of a second conductivity type opposite to said first conductivity type disposed in said substrate aligned with said body dopant implant window,
said under-gate-potion of said body region further includes an edge shallow body region disposed at an edge of said body region extending toward a center portion under said gate having a shallower depth than said body region.

8. The vertical MOSFET transistor cell as recited in claim 7 further comprising:

a source implant region of said first conductivity type disposed in said substrate aligned with a source-dopant implant window defined by an area between edges of said gate and said source-dopant implant-block.

9. The vertical MOSFET transistor cell as recited in claim 6 wherein:

a second body implant region of said second conductivity type disposed immediately next to and aligned with edges of said gate has a depth shallower than said body dopant implant region aligned with said body dopant implant window.

10. The vertical MOSFET transistor cell as recited in claim 9 wherein:

said second body-dopant region and said source implant region having substantially a same depth in said substrate.

11. A vertical power transistor cell supported on a substrate of a first conductivity type functioning as a drain, the transistor cell comprising:

a gate disposed above said substrate substantially at a center potion of said transistor cell;

a source-dopant implant-block comprising an oxide block on top of said substrate disposed in a mid portion between said gate and a neighboring gate wherein said oxide block has a width larger than two times of a lateral diffusion length of a body dopant; and a body-dopant implant blocking-mask covering said gate and extending a distance δ over edges of said polysilicon gate thus defining a body-dopant implant window between edges of said body-dopant implant blocking mask and edges of said source-dopant implant-block having a width equal to D'−δ wherein D' is a distance between edges of said gate and edges of said source-dopant implant-block.

12. The vertical power transistor cell as recited in claim 11 further comprising:

a body implant region of a second conductivity type opposite to said first conductivity type disposed in said substrate aligned with said body dopant implant window.

13. The vertical power transistor cell as recited in claim 12 further comprising:

a source implant region of said first conductivity type disposed in said substrate aligned with a source-dopant implant window defined by an area between edges of said gate and said source-dopant implant-block.

14. The vertical MOSFET transistor cell as recited in claim 11 further comprising:

a second body implant region of said second conductivity type disposed immediately next to and aligned with edges of said gate having a depth shallower than said body dopant implant region aligned with said body dopant implant window.

15. The vertical MOSFET transistor cell as recited in claim 14 wherein:

said second body-dopant region and said source implant region having substantially a same depth in said substrate.

16. The vertical MOSFET transistor cell as recited in claim 6 further comprising:

a central body-dopant implant region disposed right under said source implant-block formed as an oxide block said central body-dopant implant region disposed next to said body-dopant implant region aligned with said body-dopant implant window.

* * * * *